(12) United States Patent
Thummel

(10) Patent No.: US 6,332,766 B1
(45) Date of Patent: Dec. 25, 2001

(54) APPARATUS FOR ENCASING ARRAY PACKAGES

(75) Inventor: Steven G. Thummel, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/363,774

(22) Filed: Jul. 29, 1999

Related U.S. Application Data

(62) Division of application No. 09/019,226, filed on Feb. 5, 1998.

(51) Int. Cl.⁷ .................................................. B29C 33/12
(52) U.S. Cl. ............... 425/116; 264/272.14; 264/272.15; 264/272.17; 425/123; 425/127; 425/129.1
(58) Field of Search ......................... 264/272.14, 272.15, 264/272.17; 425/116, 123, 127, 129.1, 588

(56) References Cited

U.S. PATENT DOCUMENTS

| | | | |
|---|---|---|---|
| 4,480,975 | * 11/1984 | Plummer et al. ...................... | 425/116 |
| 4,861,251 | * 8/1989 | Moitzger ................................ | 425/116 |
| 5,034,350 | 7/1991 | Marchisi ................................ | 29/827 |
| 5,096,853 | * 3/1992 | Yasunaga et al. .................... | 437/216 |
| 5,114,880 | 5/1992 | Lin ........................................ | 438/107 |
| 5,118,271 | * 6/1992 | Baird et al. ........................... | 425/116 |
| 5,147,815 | 9/1992 | Casto .................................... | 29/827 |
| 5,222,014 | 6/1993 | Lin ........................................ | 361/792 |
| 5,239,806 | 8/1993 | Maslakow ............................. | 53/432 |
| 5,302,850 | * 4/1994 | Hara ..................................... | 257/667 |
| 5,313,365 | 5/1994 | Pennisi et al. ....................... | 361/760 |
| 5,331,205 | 7/1994 | Primeaux ............................. | 257/790 |
| 5,366,364 | 11/1994 | Tanaka et al. ....................... | 426/116 |
| 5,415,536 | * 5/1995 | Ohno .................................... | 425/121 |
| 5,458,694 | 10/1995 | Nuyen .................................. | 136/249 |
| 5,488,257 | 1/1996 | Bhattacharyya et al. ............ | 257/774 |
| 5,578,261 | 11/1996 | Manzione et al. ................... | 264/272.15 |
| 5,578,333 | * 11/1996 | Schad et al. ......................... | 425/588 |
| 5,597,643 | 1/1997 | Weber .................................. | 428/209 |
| 5,598,034 | 1/1997 | Wakefield ............................ | 257/706 |
| 5,608,262 | 3/1997 | Degani et al. ....................... | 257/723 |
| 5,609,889 | * 3/1997 | Weber .................................. | 425/116 |
| 5,614,441 | 3/1997 | Hosokawa et al. .................. | 29/827 |
| 5,615,089 | 3/1997 | Yoneda et al. ...................... | 361/764 |
| 5,633,019 | * 5/1997 | Clark et al. .......................... | 425/116 |
| 5,646,829 | 7/1997 | Sota ..................................... | 361/813 |
| 5,755,914 | 5/1998 | Yonehara ............................. | 156/281 |
| 5,766,535 | * 6/1998 | Ong ...................................... | 264/272.15 |
| 5,800,841 | * 9/1998 | Miyajima ............................. | 425/89 |
| 5,830,781 | 11/1998 | Acello et al. ........................ | 438/111 |
| 5,997,798 | * 12/1999 | Tetreault et al. .................... | 264/510 |

OTHER PUBLICATIONS

Rosato et al, Injection Molding Handbook, 1995, Chapman & Hall, p. 285–290.*

* cited by examiner

*Primary Examiner*—Nam Nguyen
*Assistant Examiner*—Emmanuel Luk
(74) *Attorney, Agent, or Firm*—TraskBritt

(57) ABSTRACT

The upper and lower mold plates of a transfer molding machine are configured for one-side encapsulation of a pair of substrate mounted electronic devices having an opposite conductor-grid-array and/or bare heat sink/dissipator. The pair of devices is positioned back-to-back within a single mold cavity for simultaneous encapsulation. A buffer member, optionally with cut-outs or apertures, may be placed between the two back-to-back substrates for protecting the grid-arrays and enabling encapsulation of devices with varying thicknesses without adjustment of the molding machine. Alternately, the upper and lower plates are configured for one-side encasement using covers of a pair of substrate mounted electronic devices having an opposite conductor-grid-array and/or bare heat sink/dissipator.

21 Claims, 11 Drawing Sheets

APPARATUS FOR ENCASING ARRAY PACKAGES

CROSS REFERENCE TO RELATED APPLICATION

This application is a divisional of application Ser. No. 09/019,226, filed Feb. 5, 1998, pending.

BACKGROUND OF THE INVENTION

1. Field of the Invention

This invention relates generally to packaging of electronic circuit device components. More particularly, the invention pertains to packaging arrangements for such device components mounted on an array substrate, though not limited to a method for encasing or covering such electronic devices. The invention further pertains to packaging arrangements for such device components mounted on an array substrate and devices for enclosing or sealing such components.

2. State of the Art

Modern packaged integrated circuits (IC) comprise one or more encased semiconductor devices or chips within a protective "package" of plastic, ceramic, moldable material, or metal or other preformed material, such as caps. The integrated circuit chips are made from a semiconductor material such as silicon, germanium or gallium arsenide, and microscopic circuits are formed on a surface of each chip surface by photolithographic techniques. A plurality of external connections, typically designed for soldering or slide connections, are connected to bond pads on one or more encased chips, enabling the chips to be electrically interconnected to an external electrical apparatus. In one form of interconnection, a substrate such as a wiring board or circuit board has an array of conductors which is typically connected to the wire bond pads of the chips. Portions of the conductors extend through the substrate, typically in through-holes or vias to the opposite side for conductive, e.g. solder, connection to another electronic apparatus. In addition to one or more semiconductor devices (chips or dies) attached to the substrate, or in lieu thereof, other devices such as resisters, capacitors, etc., as well as the conductive leads and wires, may be mounted to the substrate and incorporated in the circuit. Such elements are encased in plastic, ceramic or other material for protection.

Plastic encapsulation of semiconductor and other electronic devices by transfer molding is a well-known and much-used technique. Typically, a large number of components or devices is placed in a lower mold plate or half of an open multi-cavity mold, one device within each cavity. The mold is closed with a mating upper plate. The cavities of the mold are connected by tiny "feed runners", i.e. channels to a "pot" or reservoir from which pressurized liquified plastic is fed. Typically, a constricted channel known as a "gate" is located at the entrance to each mold cavity to limit the flow rate and injection velocity of liquified plastic into the cavity.

Where it is desired to encase the electronic components mounted on one side of a circuit board or wiring board, while leaving uncovered an array of terminals on the opposite side, a peripheral portion of the board (or of a portion encompassing a mounted circuit) is clamped and compressed between the upper and lower mold plates to prevent leakage of liquified plastic from the one side of the mold cavity. Typically, the force required to compress the plates together is of the order of tons, even for molding machines having only a few mold cavities.

Typically, powdered or pelletized plastic, e.g. thermoset resin, is placed in the resin pot and pressed by a ram. The heated, pressurized plastic becomes liquified and flows through the feed runners and gates to surround each device on one side of the substrate and fill that portion of each mold cavity, where it subsequently hardens to encapsulate one side of the board and the devices attached to it. Air is expelled from each cavity through one or more vent runners as the plastic melt fills the mold cavities. Following hardening by partial cure of the thermoset plastic, the mold plates are separated along the parting line and each encapsulated device is removed from a mold cavity and trimmed of excess plastic which has solidified in the runners and gates. Additional thermal treatment completes curing of the plastic package.

Following removal of each encased unit from its mold cavity and curing, the peripheral portions of the board may be excised from the board and any flash, i.e. plastic or other extraneous material removed from external terminals, etc. as known in the art, and the device is ready for use.

In devices having one side of the substrate configured for a ball grid array (BGA) or similar array on a circuit board, the molding process is conducted so that the surface of the circuit board having the ball grid array connections are formed on an outer surface of the package, such surface not being covered or encapsulated by the plastic material during the encapsulation process. When the substrate is sealably clamped on all sides of the cavity, plastic may reach the ball grid array side of the substrate only through the substrate, e.g. inadvertently through a hole or via. Of course, following removal from the cavity, any plastic encapsulant which may have reached and solidified on the ball grid array connection surface is removed.

The encapsulation process is typically performed before the "balls" of solder are placed on the pads of the grid array, in order to prevent possible inadvertent disforming or loss of any solder balls during encapsulation.

As disclosed in the prior art, various integrated circuit devices are configured for one-side enclosure or encapsulation, with an opposing bare or exposed side. U.S. Pat. No. 5,598,034 to Wakefield discloses an electronic device having a lower bare surface of a metallic heat conductor to prevent overheating of the integrated circuit.

U.S. Pat. No. 5,608,262 of Degani et al. shows different semiconductor devices in which a printed wiring board surface or semiconductor chip surfaces are left uncovered.

In U.S. Pat. No. 5,222,014 of Lin, a stackable multi-chip module (MCM) is shown having several levels of chip-carrying substrates with accompanying ball-grid-arrays of terminals.

U.S. Pat. No. 5,615,089 of Yoneda et al. teaches the use of a first substrate carrying chips on both surfaces, and a second substrate carrying the first substrate, wherein the second substrate has a bare surface with arrayed terminals.

In U.S. Pat. No. 5,609,889 of Weber, a mold is described which has a biased plug that exerts pressure on a heat sink or circuit board to prevent molding compound from covering its surface. A passage is provided in the substrate circuit board so that plastic flows latitudinally under the circuit board into a cavity. The plug is biased by a plate spring to accommodate variations in the thickness of the substrate and ensure that the exterior surface of the heat sink does not become significantly encased in plastic.

In each of these references, the device is one-side encapsulated in a set of mold plates, one to a mold cavity.

U.S. Pat. No. 5,313,365 of Pennisi et al. discloses an electronic conductor-grid-array package including integrated circuits bonded to one side of a printed circuit board, and a grid array on the opposing side. Instead of using transfer molding techniques, the integrated circuits and associated wiring are encased in a glob-top encapsulant Typically, glob-top encapsulation is more time consuming, less reliable, and yields a product having a less pleasing appearance than conventional transfer molding methods.

SUMMARY OF THE INVENTION

The invention comprises an improved method and apparatus for encapsulating or enclosing electronic devices mounted on the first side of a substrate such as a circuit board or wiring board. The invention may be particularly applied to one-side encapsulation or enclosing of electronic devices which includes a substrate such as a circuit board configured to have a ball-grid-array (BGA), pin-grid-array (PGA), land-grid-array (LGA) or similar set of multiple electrical terminals on its opposite side. The array terminals of such a substrate is typically configured to be bonded to terminals of another apparatus following encapsulation of the electronic devices including IC chip(s), leads, wiring and/or other components on its first side with plastic.

The method and apparatus of the invention may also be applied to a device having an exposed heat sink or heat dissipation device on one side of the substrate.

In the invention, a pair of mold plates is modified from a conventional configuration so that two array packages may be simultaneously encapsulated, back to back, within a single mold cavity. Thus, the number of packages encapsulated in a mold machine may be doubled without any significant increase in packaging cycle time.

In one embodiment of the invention, the array surfaces of the two array packages are separated by a buffer member. The buffer member may be perforated or include a cut-out to accommodate array pads, balls, pins, etc. which protrude from the bare substrate surfaces and otherwise impinge on both major surfaces of the buffer member.

The mold plates useful for the practice of the invention are typically configured to be general mirror images of each other, each of the upper and lower plates provided with a feed runner and a vent runner for the simultaneous passage of plastic melt to each array package and venting of gases therefrom.

The method is applicable to a wide variety of substrate-based conductor-grid-array packages, including those mounted on monolayer substrates, multi-layer circuit board substrates, multi-chip-modules (MCM), etc. The production rate is effectively doubled, and encapsulation of devices with different substrate thicknesses may be performed without adjustment of the mold plate spacing.

The present invention is further directed to the use of mold-like plates to apply preformed covers over the semiconductor devices on the substrates.

BRIEF DESCRIPTION OF THE SEVERAL VIEWS OF THE DRAWINGS

The invention is illustrated in the following figures, wherein the elements are not necessarily shown to scale. Corresponding parts are identified by the same numerals throughout the drawings.

DETAILED DESCRIPTION OF THE INVENTION

A method for rapid one-side encasing of array packages and an apparatus for performing such packaging are described. The several aspects of the invention arc particularly applicable to substrate-mounted arrays of ball grids, pin grids and land-grids with various encapsulable devices mounted on the opposite side of the substrate. In addition, devices having exposed heat sinks or heat radiators on the opposite side of an otherwise impermeable substrate may be rapidly one-side encapsulated by the method and apparatus of the invention. The method and apparatus are applicable to any device including a generally planar substrate, wherein one side of the substrate is to be non-encapsulated in the final packaged form.

Figure 1:
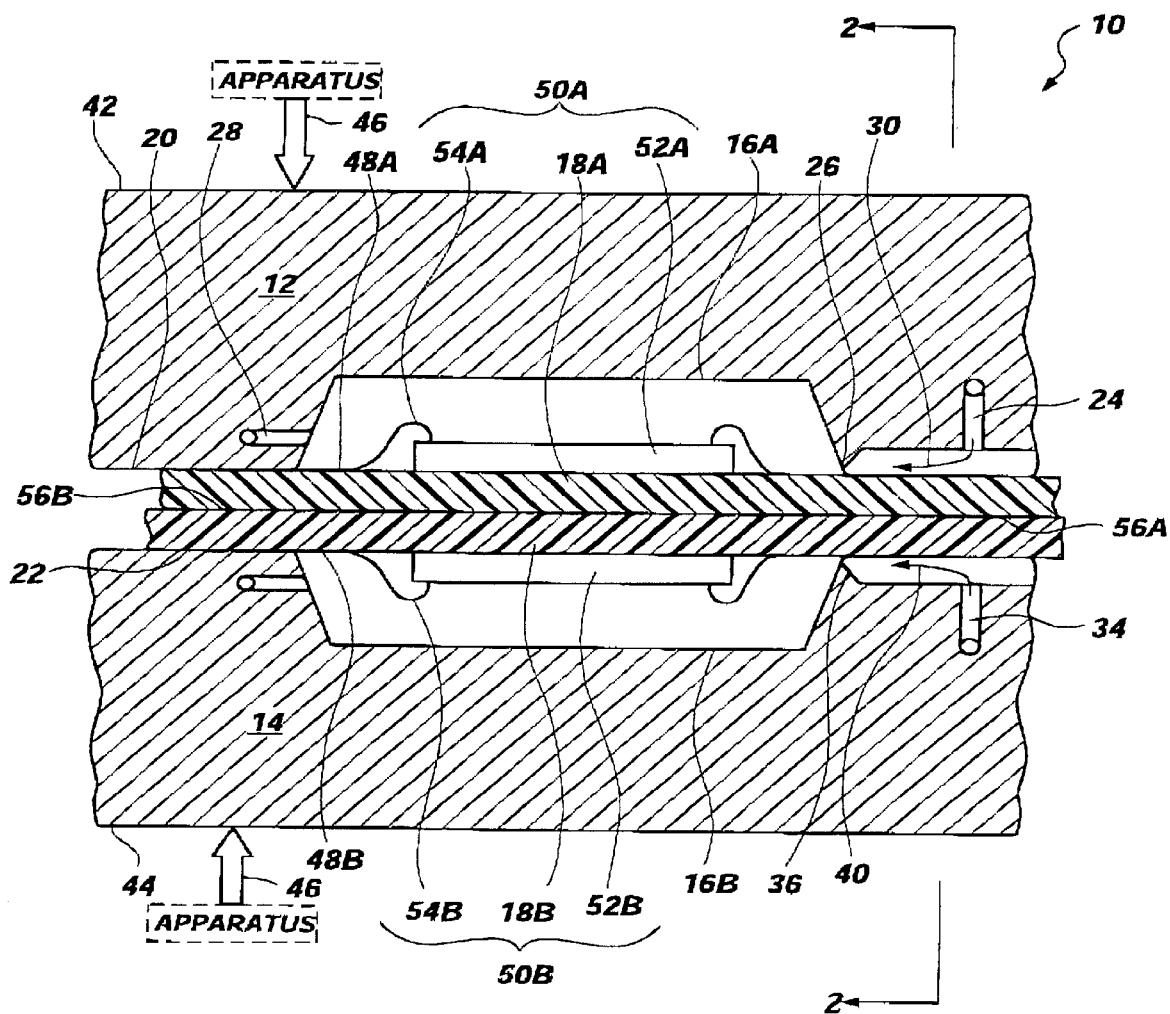
FIG. 1 is a cross-sectional end view through a portion of a molding machine of the invention for encapsulating two semiconductor devices mounted on planar substrates.
Figure 2:
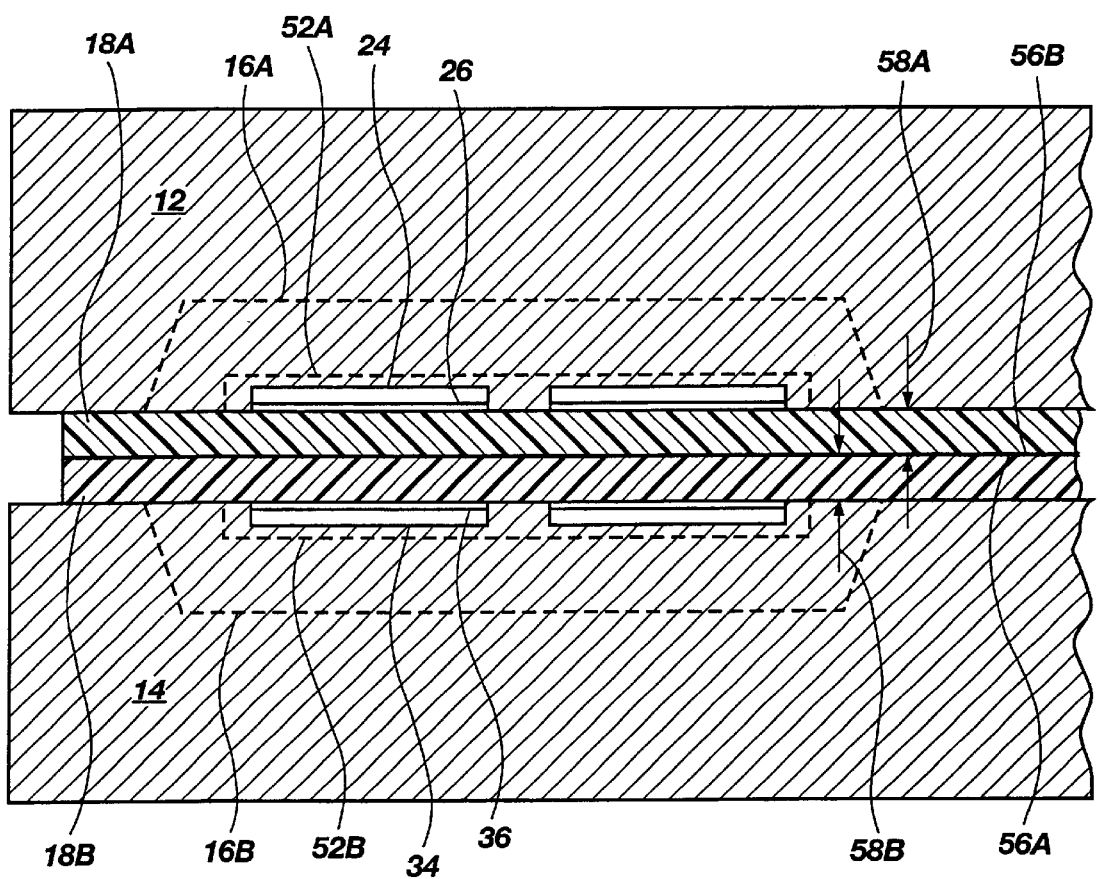
FIG. 2 is a cross-sectional side view through a portion of a molding machine of the invention, as taken along line 2—2 of FIG. 1.

With reference to the drawings of FIGS. 1–8, and particularly to FIGS. 1 and 2, a portion of a molding machine 10 is depicted, including portions of an upper mold plate 12 and a lower mold plate 14. A mold cavity 16 is shown as comprising cut-out portions of each mold plate 12, 14. In practice, the number of cavities 16 in a pair of mating mold plates 14, 16 may be any number, but usually is about 10 to 100, as needed to match the number of electronic units formed on a given substrate strip 18 and to attain the desired production rate.

The terms "upper" and "lower" are used herein for the sake of convenience only, inasmuch as the upper and lower mold plates may be exchanged in position if desired.

The upper mold plate 12 is shown as similar to a conventional, generally rectangular plate member with multiple upper cavity portions 16A along its mold face, i.e. lower flat surface 20. Each upper cavity portion 16A has an upper feed runner 24 with gate 26 for injecting a first fluid plastic 30, typically a thermoset resin, into the upper cavity portion at a controlled rate. In addition, an upper vent runner 28 for venting gas, e.g. air, from the upper cavity portion 16A during encapsulation is shown.

The lower mold plate 14 is typically a substantially mirror image of the upper mold plate 12, although it does not need to be such a mirror image, having lower cavity portion 16B which mates with the upper cavity portion 16A. Thus, the upper cavity portion 16A and mating lower cavity portion 16B together comprise a complete mold cavity 16. Each lower cavity portion 16B has a lower feed runner 34 with gate 36 for injecting a second fluid plastic 40 into each lower cavity portion at a controlled rate. Although the fluid plastics 30 and 40 may usually be the same material, encapsulants of differing composition may be used as described herein, infra. In addition, although the first fluid plastic 30 and second fluid plastic 40 are typically injected simultaneously, they may alternatively be injected in sequence, particularly if they differ.

In accordance with the invention, two electronic devices 50A and 50B are shown within the mold cavity 16, in a back-to-back orientation, the second sides 56A and 56B of substrates 18A and 18B, respectively, in abutment. Upper device 50A comprises a planar substrate 18A having a first side 48A upon which a semiconductor die 52A is attached and electrically connected thereto by wires 54A. Likewise, lower device 50B is shown as comprising a planar substrate 18B having a first side 48B upon which a semiconductor die 52B is attached and electrically connected via wires 54B or some other suitable method. The first and second devices 50A, 50B may each have an array of conductive terminals, e.g. pads, not visible, on its substrate second side 56A or 56B, respectively, each array of terminals connected by conductors (not shown) passing through the respective substrate 18A or 18B to the wires 54A, 54B of the device.

It is understood that the two devices 50A, 50B may be substantially identical, or may differ, for example, in the particular numbers and types of components attached to the substrate, in substrate composition and thickness, etc. The specifications of the two devices 50A and 50B may differ with respect to the encapsulant, and the mold plates 12, 14 and methods of this invention provide for simultaneous one-side encapsulation of different devices with different materials. Materials typically used for such encapsulation include epoxy resins, organosilicon polymers, polyimide, etc.

The upper mold plate 12 generally has a flat upper surface 42, and the lower mold plate 14 has a flat lower surface 44. Following placement of the devices 50A, 50B back-to-back between the mold plates 12, 14, compressive forces 46 are exerted upon surfaces 42, 44 to clamp the mold plates 12, 14 against the pair of substrates 18A, 18B, and the encapsulation process may proceed without leakage. The array of terminals is configured to be positioned outside of the area under high compression to avoid damage to the terminals. Thus, the area under compression is "circumferential" about each cavity, where "circumferential" refers to the excluded area rather than any circularity. The cavities are usually rectangular in shape rather than round.

Although the surfaces 20, 22 of the upper mold plate 12 and lower mold plate 14, respectively, are shown in FIG. 1 as planar, one or both of the surfaces 20, 22 may incorporate projecting ridges by which the compressive forces 46 are concentrated over a relatively small area of the substrates 18A, 18B. If this is done, the terminals of the array may be both inside and outside of the circumferential ridge about a mold cavity 16A or 16B or both.

Figure 3:
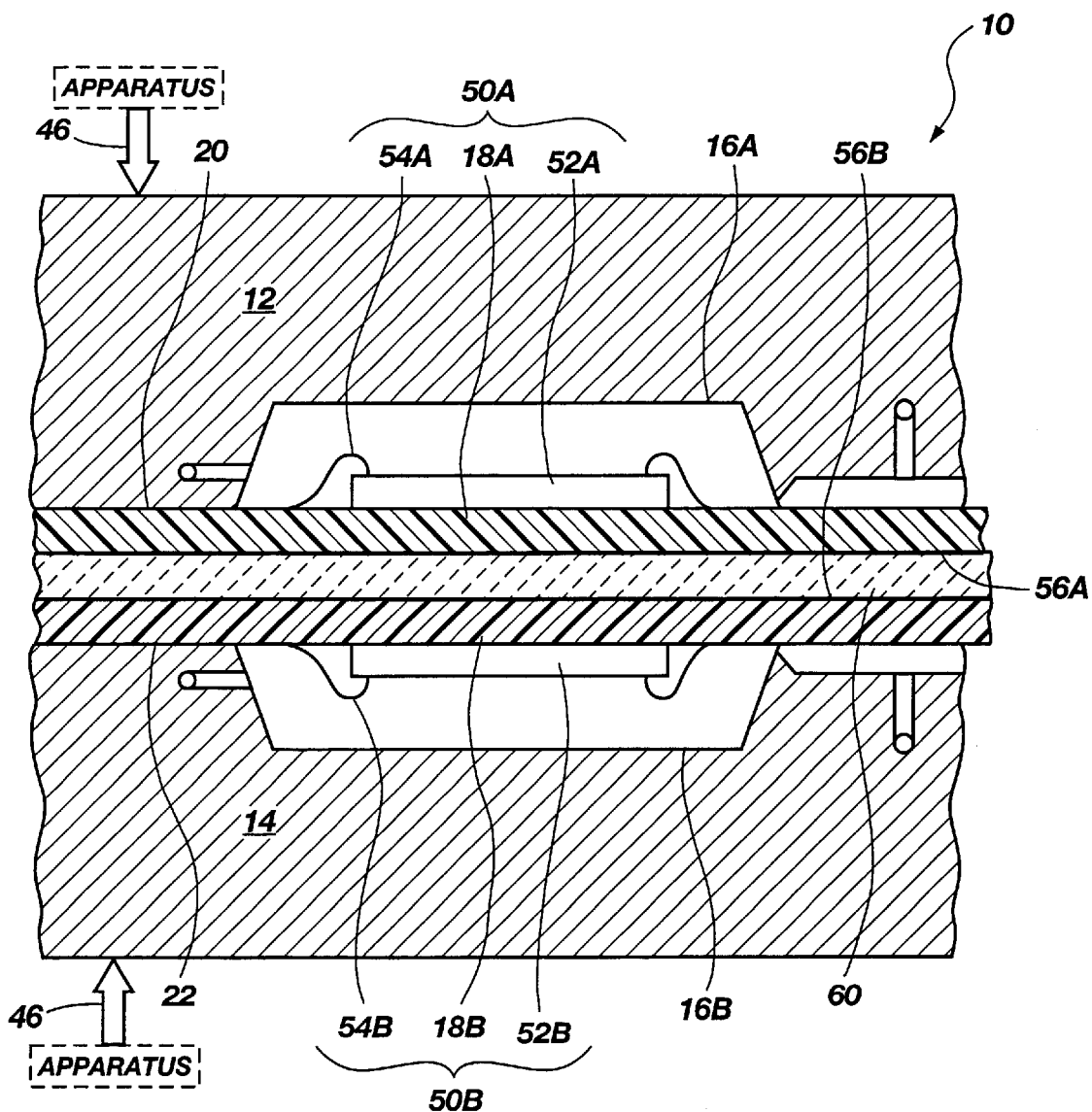
FIG. 3 is a cross-sectional end view through a portion of a molding machine, illustrating another embodiment of the invention.

FIG. 3 depicts the same mold plates 12, 14 as shown in FIGS. 1 and 2. In this embodiment, a buffer member 60 is placed between second side 56A of substrate 18A and the second side 56B of substrate 18B. As indicated previously, both of these sides 56A, 56B have terminal grid arrays such as pads, solder balls, pins, etc. or they include bare surface heat sinks or heat dissipators. These elements require protection from high compression forces, lateral forces, and the flow of encapsulant during the packaging process.

Figure 4:
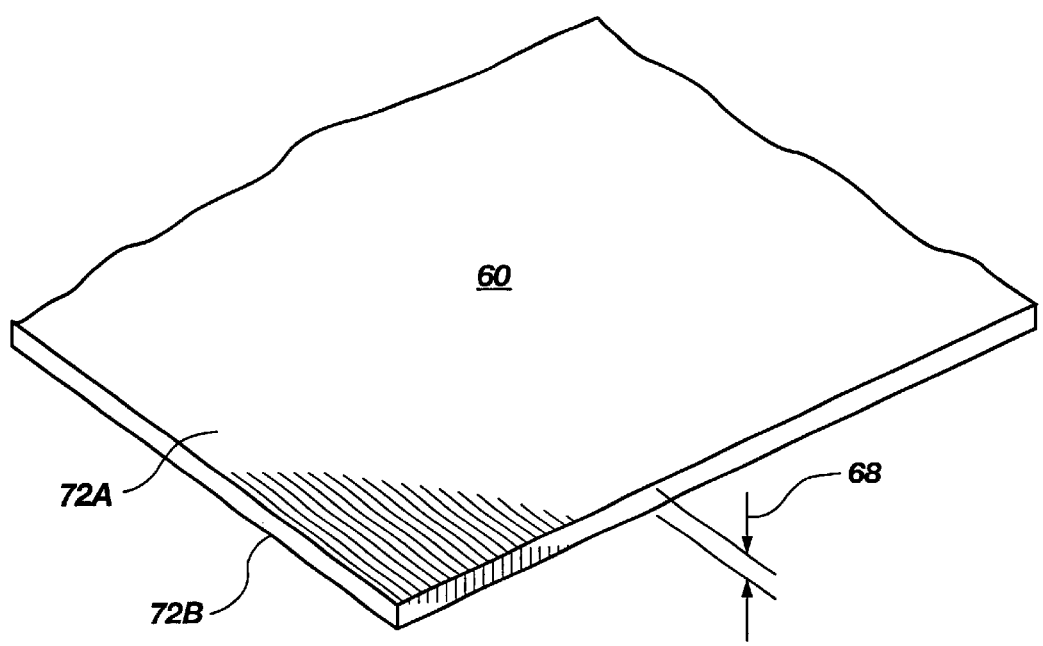
FIG. 4 is a perspective view of an exemplary planar intermediate buffer member useful in an encapsulation method of the invention.

A buffer member 60 is illustrated in FIG. 4 as a flat or planar body typically with parallel surfaces 72A, 72B, and having thickness 68. Typically, the buffer member 60 will be continuous and generally coextensive with each strip of substrate 18A, 18B. The buffer member 60 may alternatively be formed of multiple portions more readily fitted to the arrays of balls, pins, pads, etc.

The buffer member 60 serves several purposes:

First, buffer members 60 of differing thicknesses may be readily provided for encapsulation of packages having varying substrate thicknesses 58A, 58B (see FIG. 2). For example, when a pair of array devices 50A, 50B having a reduced substrate thickness 58A and/or 58B is to be one-side encapsulated, a buffer member 60 of greater thickness dimension 68 may be used to compensate for the thinner substrates 18A, 18B. The tedious adjustment of the molding machine 10 for a different mold plate clearance to accommodate varying substrate thicknesses 58A, 58B may be avoided.

Second, the buffer member 60 absorbs some of the compressive forces 46 exerted during the encapsulation, protecting the array terminals from breakage or distortion.

Third, the buffer member 60 may be adapted to accommodate projecting array terminals such as pin-grid arrays and ball-grid-arrays, etc., preventing damage to the pins or solder balls resulting from compression against the opposite substrate or the buffer member 60 itself.

Fourth, the buffer member 60 enhances the ease of separating the two array devices 50A, 50B without damage, following encapsulation.

The buffer member 60 does not become part of a packaged device and may be, for example, a thin metallic member such as aluminum, copper, or various other suitable materials. Alternatively, the buffer member 60 may comprise a plastic material such as polyimide, polytetrafluoroethylene, silicones, epoxies, etc. The buffer member 60 may also be a circuit board or wiring board, or other material. As best delineated, the material has a rigidity which limits the degree to which it will deform under the typical compression range useful in the encapsulation process. Thus, the material will typically become compressed under the exerted compression forces.

In addition, the buffer material will be non-adhesive, not adhering to either substrate.

Figure 6:
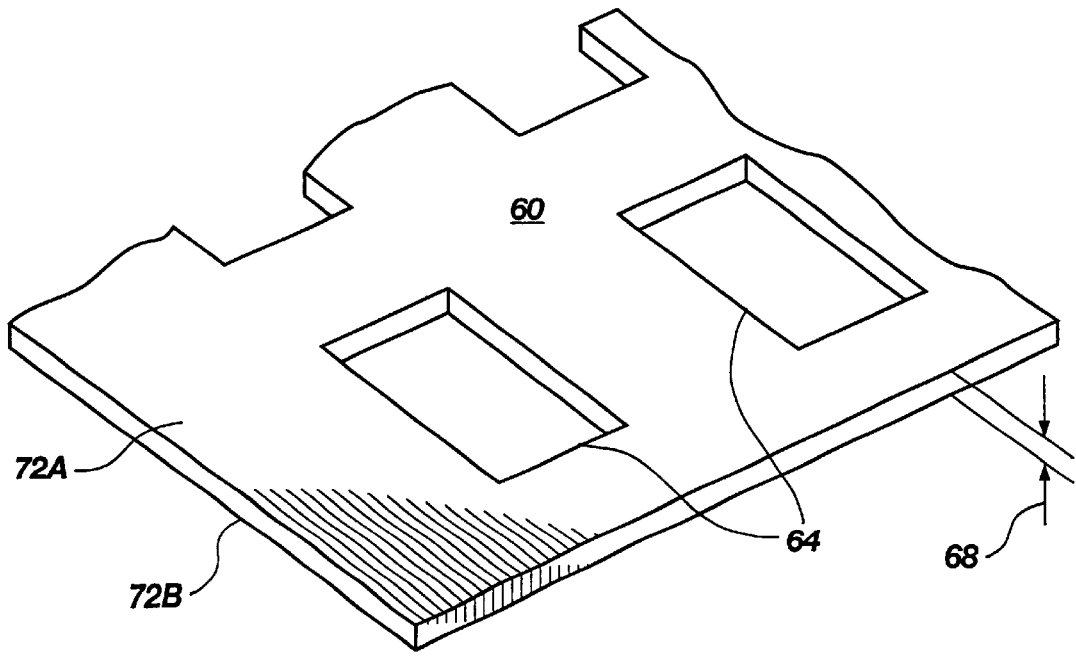
FIG. 6 is a perspective view of another exemplary planar intermediate buffer member useful in an encapsulation method of the invention.
Figure 5:
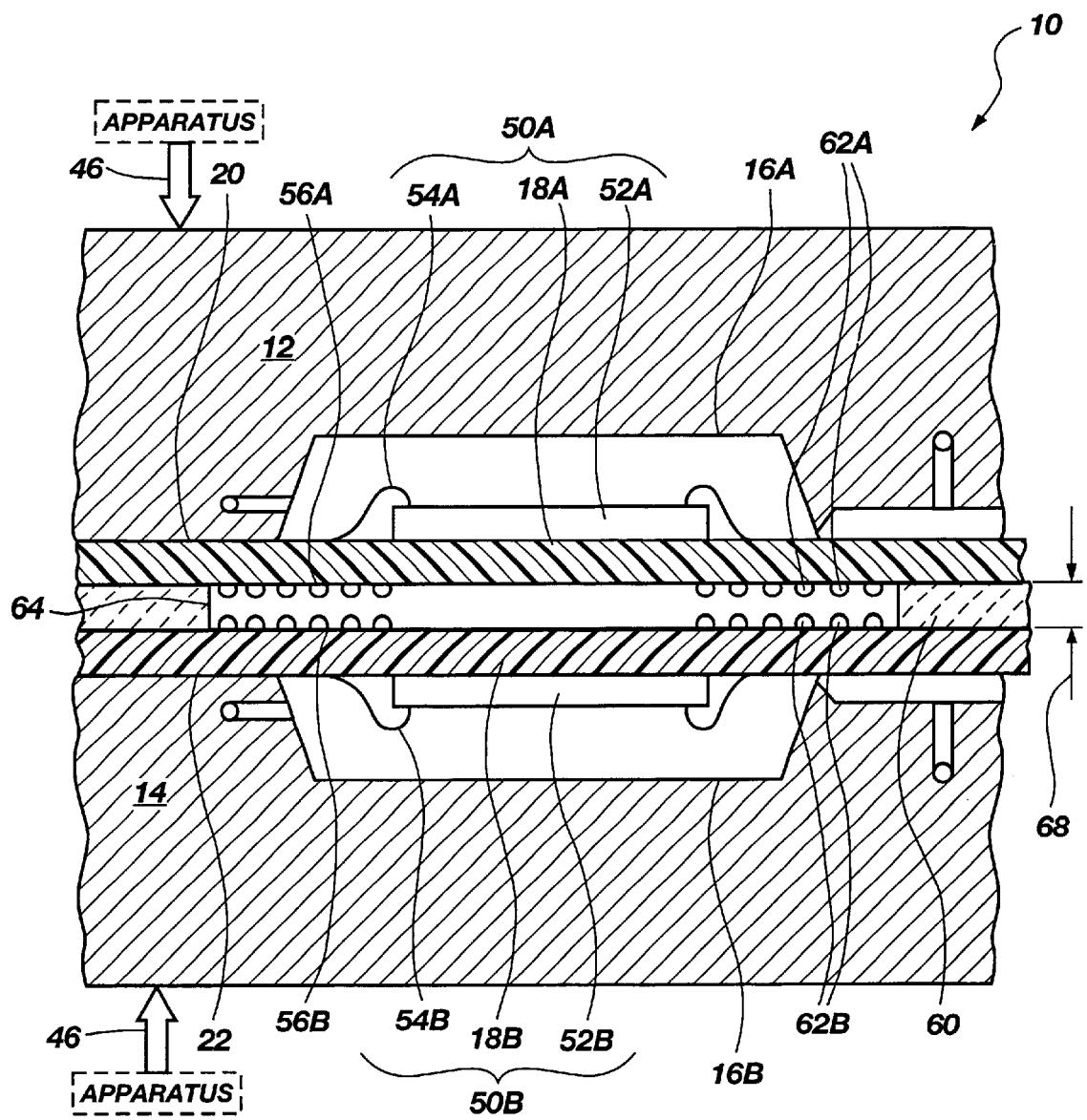
FIG. 5 is a cross-sectional end view through a portion of a molding machine, illustrating the use of another embodiment of the buffer member of the invention.

In FIG. 5, the molding plates of FIG. 1 are shown in a method for one-side encapsulation of a pair of typical devices 50A and 50B, each comprising components 52A, 54A (or 52B, 54B) mounted on a substrate 18A (or 18B) such as a circuit board with a ball-grid-array of solder balls 62A, 62B, respectively. The devices 50A, 50B are placed back-to-back in the mold cavity 16, with an intervening buffer member 60. The substrates and buffer member 60 form a "laminar" arrangement, though they are not attached to each other. As depicted in FIGS. 5 and 6, the buffer member 60 includes cut-outs 64 and 66, respectively, into which the arrays of solder balls 62A and 62B are positioned. The thickness 68 of the buffer member 60 in a compressed condition enables the solder balls 62A 62B from both substrates 18A, 18B to fit within the cut-outs 64, 66 without touching, so that deformation or damage to the solder balls is avoided. For typical ball-grid-arrays (BGA), the thickness 68 of the buffer member 60 will be sufficient to accommodate both sets of solder balls 62A, 62B. Where used for pin-grid-arrays (PGA), the required thickness will vary depending upon pin length.

Unlike the method shown in FIG. 1, this method enables one-side encapsulation of devices following installation of the solder balls.

As already indicated, this method is shown in FIG. 5 for devices with ball-grid-arrays (BGA). The method shown in FIG. 5 is equally useful for substrates in which a pin-grid-array (PGA) or land-grid-array (LGA), etc., or others, with pads having already been provided in the substrate.

The cut-out 64 and 66 may be made in the buffer member 60 by any feasible method, including stamping or laser cutting.

Figure 7:
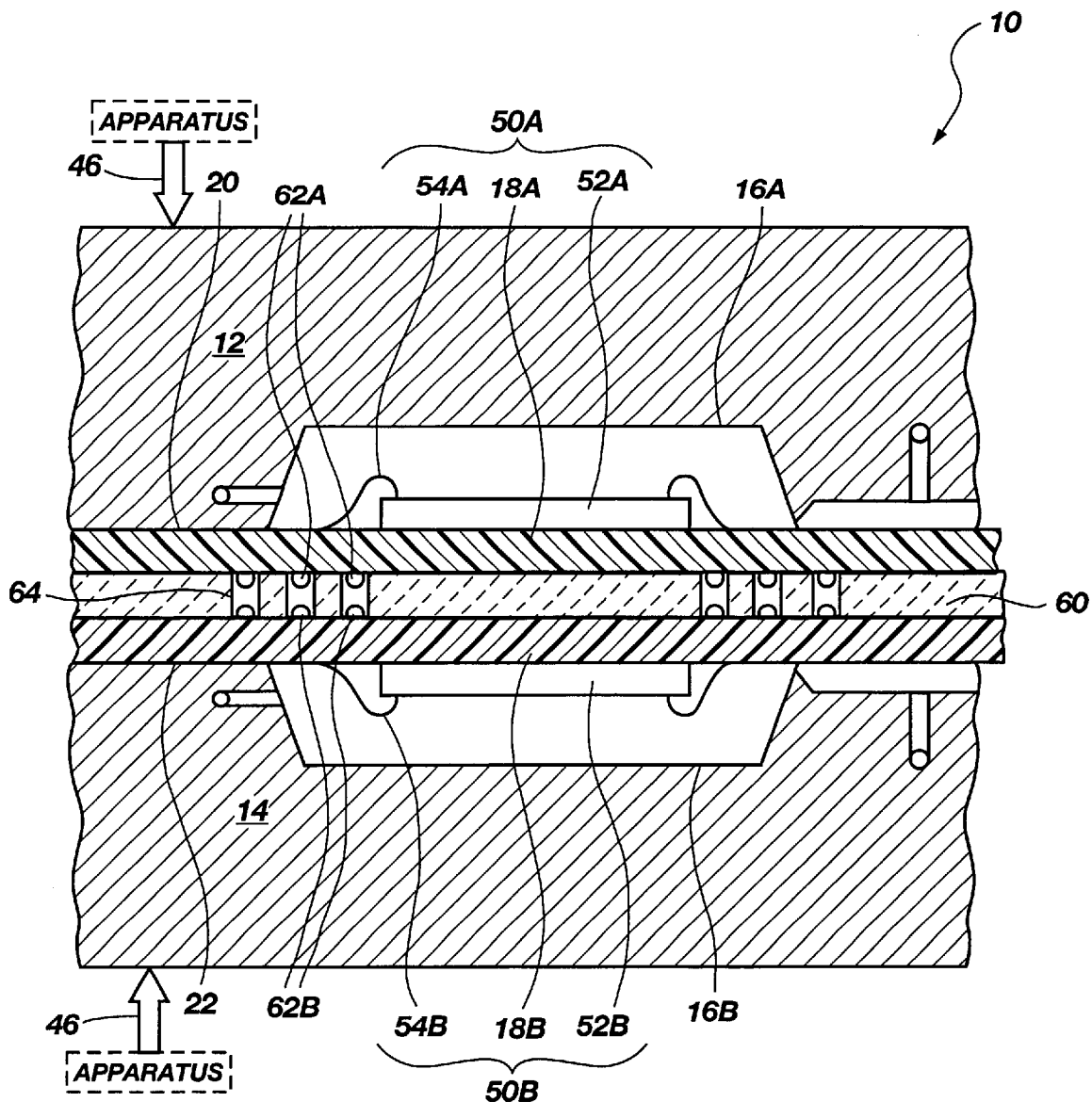
FIG. 7 is a cross-sectional end view through a portion of a molding machine, illustrating the use of a further embodiment of the buffer member of the invention.
Figure 8:
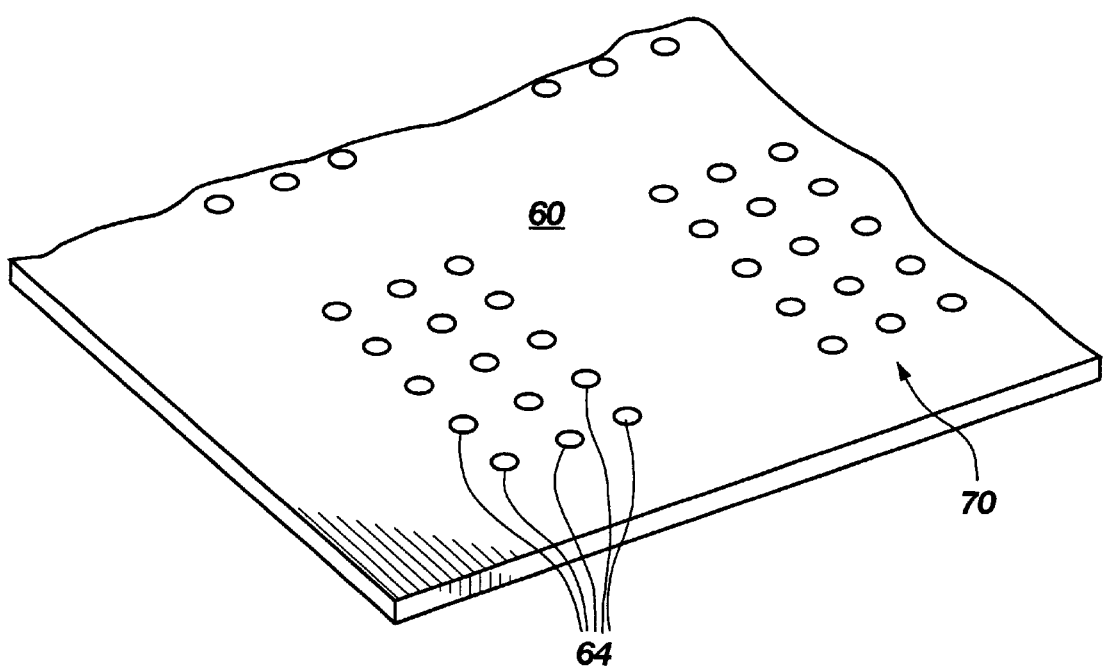
FIG. 8 is a perspective view of a further embodiment of a planar intermediate buffer member useful in an encapsulation method of the invention.

FIGS. 7 and 8 illustrate a further embodiment of the invention. The buffer member 60 is perforated with groupings 70 of cut-outs 66 to accommodate array pads, balls, pins, etc. which protrude from the bare substrate second sides 56A, 56B and which otherwise would impinge on both major surfaces 72A, 72B of the buffer member. The cut-outs 66 are aligned with the conductors and are of such a size to accommodate the usual variability in positioning of the substrates 18A, 18B on the buffer member 60. The cut-outs 66 in the buffer member 60 may be formed by any method capable of forming small holes, including laser cutting or "drilling", and extend from the upper surface 72A to the lower surface 72B.

Buffer members 60 may be easily and quickly fabricated in a variety of thicknesses 68, using conventional techniques. Thus, a wide variety of device designs may be one-side encapsulated without adjustment of the molding machine tolerances.

The buffer member 60 may typically be re-used more than once, and may be usable repeatedly, thus saving time and materials.

The buffer member 60 may be formed of a variety of relatively inexpensive materials, because it does not require very specific qualities such as chemical resistance, etc.

Figure 9:
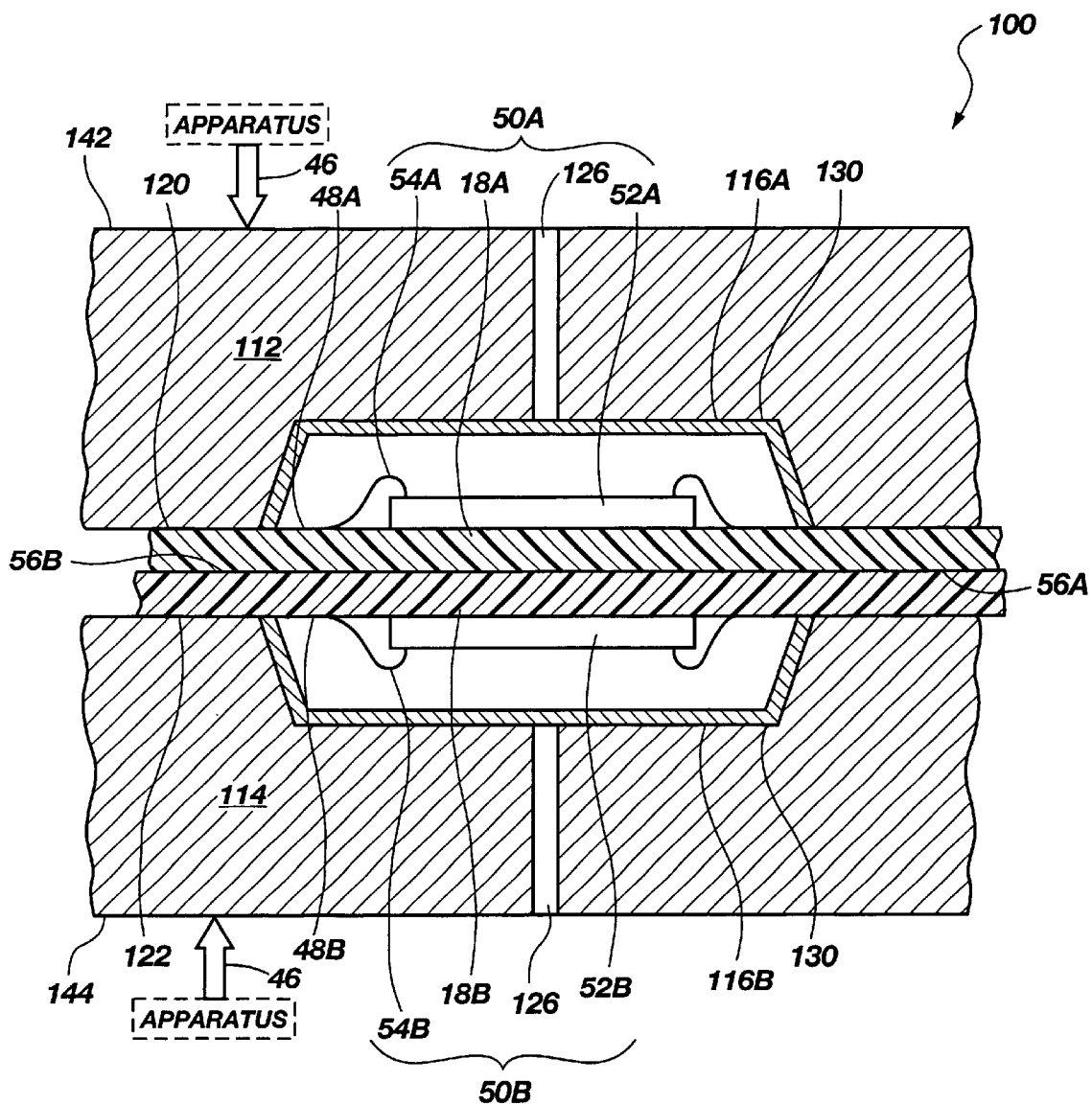
FIG. 9 is a cross-sectional end view through a portion of an apparatus of another embodiment of the invention for applying a cover to the two semiconductor devices mounted on planar substrates.

With reference to FIG. 9, another embodiment of the present invention is illustrated wherein portions of isothermal blocks of an apparatus 100 are depicted, including portions of an upper isothermal plate 112 and a lower isothermal plate 114. A cavity 116 is shown as comprising cut-out portions of each plate 112, 114. In practice, the number of cavities 116 in a pair of mating plates 112, 114 may be any number, but is about 10 to 100, as needed to match the number of electronic units formed on a given substrate strip 18 and to attain the desired production rate.

The terms "upper" and "lower" are used herein for the sake of convenience only, inasmuch as the upper and lower plates may be exchanged in position if desired.

The upper plate 112 is shown as similar to a conventional, generally rectangular plate member with multiple upper cavity portions 116A along its face, i.e. lower flat surface 120. Each upper cavity portion 116A has an aperture 126 therein connected to a source of vacuum.

The lower plate 114 is a substantially mirror image, although not required, of the upper plate 112, having lower cavity portion 116B which mates with the upper cavity portion 116A. Thus, the upper cavity portion 116A and mating lower cavity portion 116B together comprise a complete cavity 116. Each lower cavity portion 116B has an aperture 126 therein connected to a source of vacuum.

In accordance with the invention, two electronic devices 50A and 50B are shown within the cavity 116, in a back-to-back orientation, the substrate second sides 56A and 56B, respectively, in abutment. Upper device 50A comprises a planar substrate 18A having a first side 48A upon which a semiconductor die 52A is attached and electrically connected thereto by wires 54A or some other suitable connection. Likewise, lower device 50B is shown as comprising a planar substrate 18B having a first side 48B upon which a semiconductor die 52B is attached and electrically connected via wires 54B. The first and second devices 50A, 50B may each have an array of conductive terminals, e.g. pads, not visible, on substrate second side 56A or 56B, respectively, each array of terminals connected by conductors (not shown) passing through the respective substrate 18A or 18B to the wires 54A, 54B of the device.

Contained within cavity 116A of upper plate 112 is a cover 130 being held therein through the use of a vacuum supplied through aperture 126 after being placed therein in any suitable manner. Similarly, contained within cavity 116B of lower plate 114 is a cover 130 being held therein through the use of a vacuum supplied through aperture 126 after being placed therein in any suitable manner. The covers 130 may be of any type of suitable material in any suitable shape for application to the substrate 18A or 18B to encase the semiconductor die 52A and 52B respectively.

It is understood that the two devices, 50A and 50B may be substantially identical, or may differ, for example, in the particular numbers and types of components attached to the substrate, in substrate composition and thickness, etc. The specifications of the two devices 50A and 50B may differ with respect to the cover 130 and the plates 112, 114 and methods of this invention provide for simultaneous one-sided encapsulating of different devices with different materials.

The upper plate 112 generally has a flat upper surface 142, and the lower plate 114 has a flat lower surface 144. Following placement of the devices 50A, 50B back-to-back between the plates 112, 114, compressive forces 46 are exerted upon surfaces 142 144 to clamp the plates 112, 114 against the pair of substrates 18A, 18B and the process proceeds to attach, such as by using adhesive bonding, the covers 130 to the substrate 18A, 18B. The lower edge of each cover 130 may be coated with a suitable adhesive to attach the cover 130 to the substrate 18A, 18B. The wire bonds to the circuits of the substrate 18A, 18B are placed to be located outside the area of compression of the edge of the cover 130 on the substrate 18A, 18B. As stated, the cover 130 may be of any shape desired to enclose and isolate a desired area on the substrate 18A, 18B.

Figure 10:
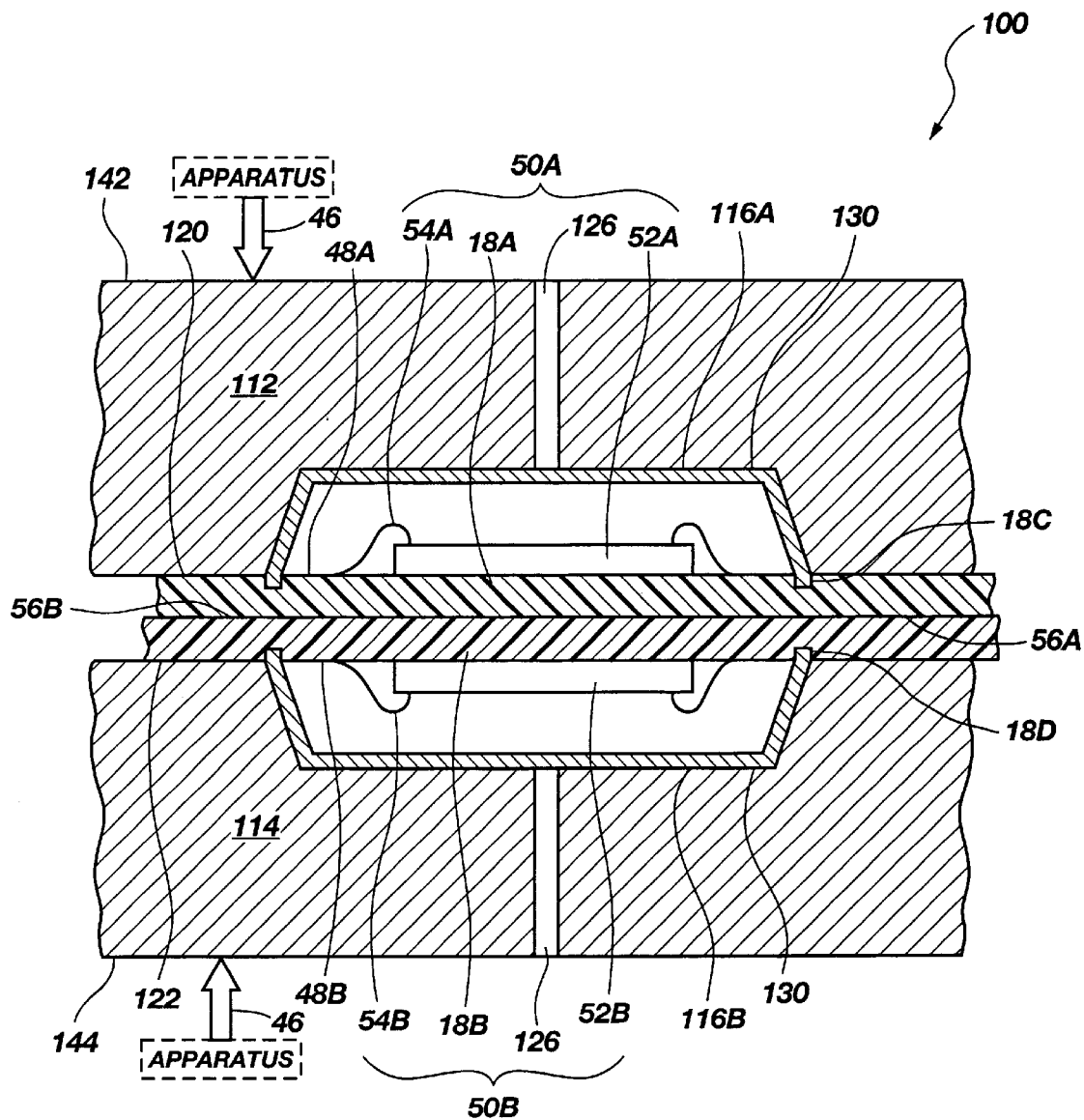
FIG. 10 is a cross-sectional end view through a portion of an apparatus of another embodiment of the invention for applying another type cover to the two semiconductor devices mounted on planar substrates.

Referring, to FIG. 10, another embodiment of the present invention is shown such as illustrated in FIG. 9, except that each cover 130 has the lower edge thereof secured in a recess 18C or 18D formed in substrate 18A, 18B respectively. The lower edge of cover 130 may be secured in the recess 18C, 18D of substrate 18A, 18B, respectively, by means of a suitable adhesive or any other suitable, well-known attachment.

Figure 11:
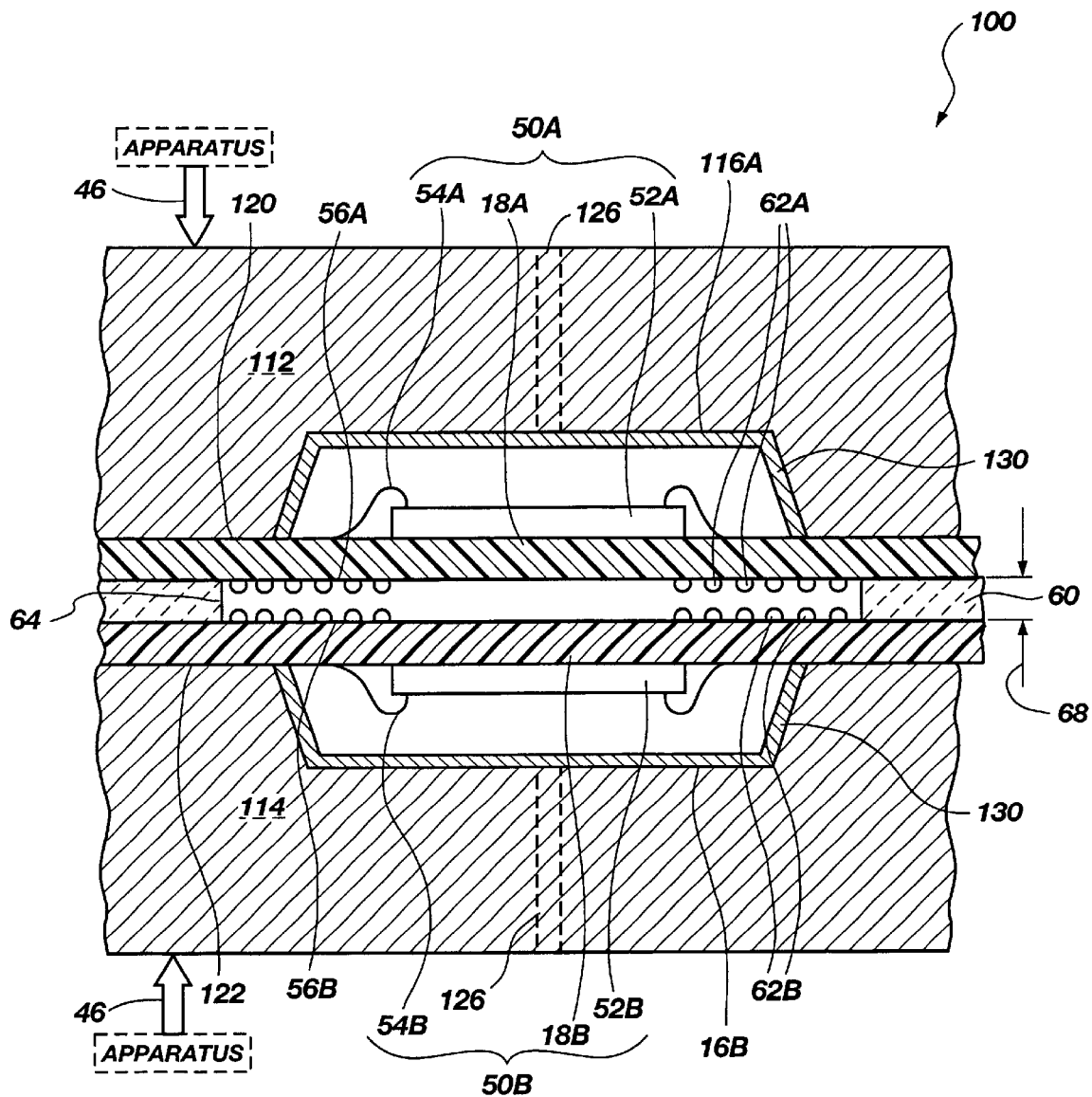
FIG. 11 is a cross-sectional end view through a portion of an apparatus of another embodiment of the invention for applying a cover to the two semiconductor devices mounted on planar substrates, illustrating the use of an embodiment of the buffer member of the invention.

Referring to FIG. 11, another embodiment of the present invention is shown wherein the plates of FIG. 9 are used for one-side encapsulation of a pair of typical devices 50A and 50B, each comprising components 52A, 54A (or 52B, 54B) mounted on a substrate 18A (or 18B) such as a circuit board with a ball-grid-array of solder balls 62A, 62B, respectively. The devices 50A, 50B are placed back-to-back in the mold cavity 116, with an intervening buffer member 60. The substrates and buffer member 60 form a "laminar" arrangement, though they are not attached to each other. As depicted in FIGS. 11 and 5, the buffer member 60 includes a cut-out 64 and 66, respectively, into which the arrays of solder balls 62A and 62B are positioned. The thickness 68 of the buffer member 60 in a compressed condition enables the solder balls 62A, 62B from both substrates 18A, 18B to fit within the cut-out 64 without touching, so that deformation or damage to the solder balls is avoided. The cover 130 is attached to substrate 18A, 18B by any suitable arrangement, such as adhesive bonding, etc.

Figure 12:
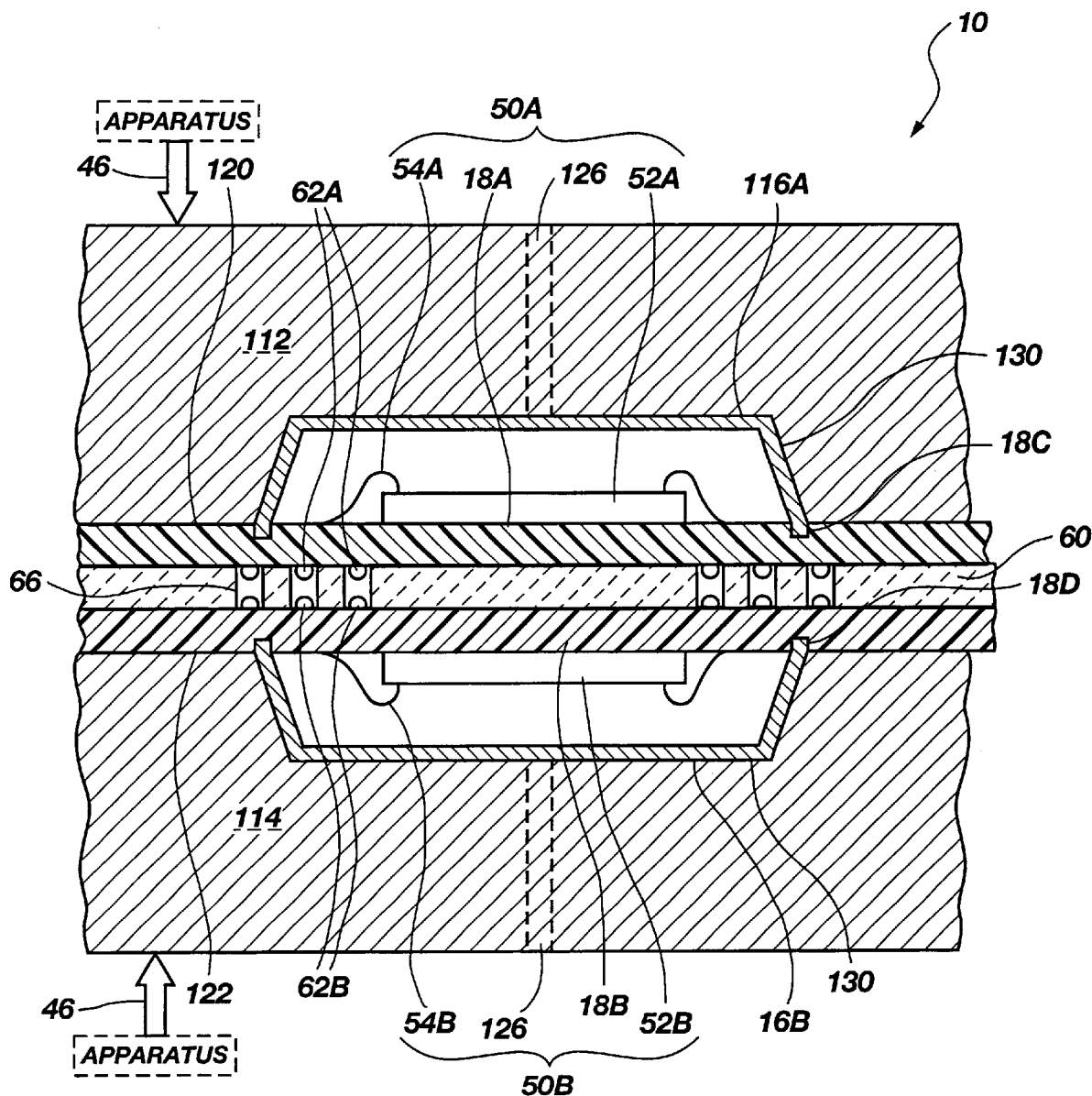
FIG. 12 is a cross-sectional end view through a portion of an apparatus of another embodiment of the invention for applying a cover to the two semiconductor devices mounted on planar substrates, illustrating the use of a further embodiment of the buffer member of the invention.

Referring to FIG. 12, another embodiment of the invention is shown with the outer edge of cover 130 being retained in a recess 18C, 18D of the substrate 18A, 18B respectively. The cover 130 may be secured in the recess 18C, 18D of substrate 18A, 18B by any suitable arrangement, such as adhesive bonding, etc.

Use of the foregoing apparatus and methods effectively doubles the production rate of a transfer molding machine or like apparatus to apply covers to the substrates without increasing the rejection rate. This results in a much lower unit cost. The grid-arrays of pads, solder balls or pins, as well as any bare heat sinks or heat dissipators, are protected from damage.

If desired, devices of different designs may be one-side encapsulated together within a mold cavity, and may even be simultaneously encapsulated with different materials. Such is further applicable for the application of covers to the substrates to encase the semiconductor die.

It is apparent to those skilled in the art that various changes and modifications may be made to the biased floating plate apparatus and relief/venting apparatus of the invention as disclosed herein without departing from the spirit and scope of the invention as defined in the following claims.

What is claimed is:

1. A mold apparatus for one sided encapsulation of two electronic device simultaneously, said mold apparatus comprising:

two electronic devices having electronic components mounted on one side of a substrate, said substrate having a varying thickness, having a first side having said electronic components mounted thereon, and having a an opposing backside free of electronic components mounted thereon;

an upper mold plate and a mating lower in mold plate, each mold plate having a mold cavity portion, the cavity portion in each said upper and lower mold plates comprising a mold cavity receiving a portion of said substrate having said electronic component therein for encapsulating said electronic component on each substrate of said two substrate-based electronic devices are situated backside-to-backside in said mold cavity;

a force applying device for applying a force to said upper mold plate and said lower mold plate about said substrate of an intervening first electronic device of said two electronic devices and a substrate of an intervening second electronic device of said two electronic devices situated backside-to backside, said mold cavity portion of said upper mold plate forming a first mold cavity over at least a portion of one of said first and second electronic devices and said mold cavity portion of said lower mold plate forming a second mold cavity over at least a portion of the other of said first electronic device and second electronic device of said two electronic devices; and at least one passageway in each said upper mold plate and said lower mold plate for separately introducing material into said first mold cavity and said second mold cavity to encapsulate one side of each said first electronic device and said second electronic device of said two electronic devices.

2. The mold apparatus of claim 1, further comprising:

at least one passageway connected to each of said first and second mold cavities venting gases from each of said first and second mold cavities.

3. The mold apparatus of a claim 1, wherein said mold apparatus comprises an injection molding apparatus.

4. A mold apparatus for one sided encapsulation of two electronic device simultaneously, said mold apparatus comprising:

two electronic devices, each electronic device having electronic components mounted on a front side of a substrate, said substrate having an opposing backside free of an electronic device;

an upper mold plate and a mating lower mold plate, each mold plate having a mold cavity portion, the cavity portion in each said upper and lower mold plates comprising a mold cavity encapsulating at least a portion of said substrate having an electronic component thereon, said two electronic devices situated backside of said substrate of one of said two electronic devices to backside of said substrate of the other of said two electronic devices in said mold cavity;

a force applying device for applying a force to said upper mold plate and said lower mold plate about a substrate of an intervening first electronic device of said two electronic devices and a substrate of an intervening second electronic device of said two electronic devices oriented in a backside to backside configuration, said mold cavity portion of said upper mold forming a first mold cavity over at least a portion of one of said first electronic device of said two electronic devices and said second electronic device of said two electronic devices and said mold cavity portion of said lower mold plate forming a second mold cavity over at least a portion of the other of said first electronic device of said two electronic devices and said second electronic device of said two electronic devices;

at least one passageway separately introducing material into said first mold cavity and said second mold cavity to encapsulate one side of each said first electronic device of said two electronic devices and said second electronic device of said two electronic devices; and a planar buffer member configured to be positioned between opposing backsides of said backside to backside substrates of said first electronic device of said two electronic devices and said second electronic device of said two electronic devices.

5. The mold apparatus of claim 4, wherein each said first electronic device of said two electronic devices and said second electronic device of said two electronic devices has a conductor-grid-array on said opposing backside of said substrate thereof, and said planar buffer member has cut-out portions for insertion therein of conductor-grid-arrays of said first electronic device of said two electronic devices and said second electronic device of said two electronic devices.

6. The mold apparatus of claim 4, wherein each said first electronic device of said two electronic devices and said second electronic device of said two electronic devices has a conductor-grid-array on said opposing backside of said substrate, and said planar buffer member has perforation apertures therein for insertion therein of conductor-grid-arrays of said first electronic device of said two electronic devices and said second electronic device of said two electronic devices.

7. An apparatus for one-side encapsulation of each of two substrate-based electronic devices of varying thickness within a single cavity of upper and lower mold plates of a transfer mold, said apparatus comprising:

first and second substrate-based electronic devices, each electronic device having a separate substrate having with electronic components on a first side thereof and a conductor-grid array on an opposite second side, said second sides of said substrates of said first and second electronic devices abutting in a back-to-back orientation having a portion of said substrates positioned and compressed by said upper and lower plates generally circumferentially about each said electronic device, said back-to-back substrates dividing said single cavity into a first mold cavity extending over said electronic component of one of said first and second devices and a second mold cavity extending over said electronic component of the other of said first and second devices, said back-to-back substrates substantially inhibiting fluid communication between said first and second mold cavities.

8. A mold apparatus for one sided encapsulation of two electronic device simultaneously, said mold apparatus comprising:

two electronic devices, each electronic device having electronic components mounted on one side of a substrate of varying thickness, said substrate having an opposite backside;

an upper mold plate and a mating lower mold plate, each mold plate having a mold cavity portion, matching cavity portions in each said upper and lower mold plates comprising a mold cavity having one-side encapsulation of two substrate-based devices situated having respective substrates positioned opposite backside to opposite backside in said mold cavity;

a force applying device for applying a force compressing said upper mold plate and mating lower mold plate about a substrate of an intervening first substrate-based device and a substrate of an intervening second substrate-based device oriented opposite backside to opposite backside, said mold cavity portion of said upper mold plate forming a first mold cavity over at least a portion of said first substrate-based device and said mold cavity portion of said lower mold plate forming a second mold cavity over at least a portion of said second substrate-based device, said first mold cavity substantially isolated from said second mold cavity by said opposite backside to opposite backside substrates of said two electronic devices;

passageways separately introducing fluid plastic into each of said first and second mold cavities encapsulating at least portions of one side of each said first and second substrate-based devices of said two electronic devices.

9. The mold apparatus of claim 8, further comprising:

apparatus connected to each of said first and second mold cavities for venting gases from each of said first and second mold cavities.

10. The mold apparatus of claim 8, wherein said mold apparatus comprises an injection molding apparatus.

11. A mold apparatus for one sided encapsulation of two electronic devices mounted on one side of substrate simultaneously, said mold apparatus comprising:

two electronic devices, each electronic device having electronic components mounted on one side of a substrate, said substrate having an opposite second side free of electronic components mounted thereon;

an upper mold plate and a mating lower mold plate, each mold plate having a mold cavity portion;

a force applying device for applying a force compressing said upper mold plate and mating lower mold plate about a substrate of an intervening first substrate-based device and a substrate of an intervening second substrate-based device disposed opposite second side to opposite second side, said mold cavity portion of said upper mold plate forming a first mold cavity over at least a portion of said first substrate-based device and said mold cavity portion of said lower mold plate forming a second mold cavity over at least a portion of said second substrate-based device, said first mold cavity substantially isolated from said second mold cavity by said back to back substrates;

passageways introducing fluid plastic into each of said first and second mold cavities encapsulating one side of each said first substrate-based device and said second substrate-based device of said two substrate-based devices;

and a planar buffer member positioned between said opposite second sides of said substrates of said first substrate-based device and said second substrate-based device of said two substrate-based devices.

12. The mold apparatus of claim 11, wherein each of said two substrate-based devices has a conductor-grid-array on said second side of said substrate, and said planar buffer member has cut-out portions for insertion therein of conductor-grid-arrays of said first and second substrate-based devices.

13. The mold apparatus of claim 11, wherein each of said two substrate-based devices has a conductor-grid-array on said second side of said substrate, and said planar buffer member has perforation apertures therein for insertion therein of said conductor-grid-arrays of said first and second substrate-based devices.

14. An apparatus for one-side encapsulation of each of two substrate-based electronic devices within a single cavity of upper and lower mold plates of a transfer mold, said arrangement comprising:

first and second substrate-based devices, each device having a separate substrate having electronic components on a first side and a conductor-grid array on an opposite second side, said second sides of said substrates of said first and second devices oriented in a back-to-back opposite second side to opposite second side orientation; and a separate planar buffer member, not part of said first and second devices, positioned between said second sides of said substrates, said buffer member and said substrates forming a laminar arrangement, a portion of said laminar arrangement compressed between said upper and lower plates generally circumferentially about each said device, said laminar arrangement dividing said single cavity into a first mold cavity extending over at least a portion of one of said first and second substrate-based devices and a second mold cavity extending over at least a portion of the other of said first and second substrate-based devices.

15. The arrangement of claim 14, wherein said buffer member has a cut-out therein for enclosing said conductor-grid-arrays of both devices.

16. The arrangement of claim 14, wherein said buffer member includes apertures therethrough for enclosing said conductor-grid-arrays of both devices.

17. An apparatus for enclosing a plurality of electronic devices, said apparatus comprising:

a plurality of electronic devices, each electronic device of said plurality of electronic devices having at least one electronic component mounted on one side of a substrate having a varying thickness, said substrate having an opposite second side;

an upper plate and a mating lower plate, each plate having a cavity portion, matching cavity portions in each said upper and lower plates comprising a cavity for one-sided application of a cover to said plurality of electronic devices situated in opposite second side of a substrate having at least one electronic component mounted on one side of thereof to opposite second side of another substrate having at least one electronic component mounted on one side thereof in said cavity; and a force applying device for applying a force for mating said upper plate and said lower plate about a substrate of an intervening first substrate having at least one electronic component mounted on one side of thereof and a second substrate having at least one electronic component mounted on one side of thereof disposed opposite second side of said first substrate to opposite second side of said second substrate, said cavity portion of said upper plate forming a first cavity over at least a portion of said first substrate and said cavity portion of said lower plate forming a second mold cavity over at least a portion of said second substrate and separated from said first cavity.

18. An apparatus for enclosing a plurality of electronic devices, said apparatus comprising:

a plurality of electronic devices, each electronic device of said plurality of electronic devices having at least one electronic component mounted on one side of a substrate having a varying thickness, said substrate having an opposite second side free of electronic components;

an upper plate and a mating lower plate, each plate having a cavity portion, matching cavity portions in each said upper and lower plates comprising a cavity configured for one-sided application of a cover to said plurality of electronic devices in said cavity, a force applying device for applying a force for mating said upper plate and said lower plate about an intervening substrate of a first electronic device and a substrate of an intervening second electronic device oriented in the opposite second side of the substrate of said first electronic device to the opposite second side of the second electronic substrate, said cavity portion of said upper plate forming a first cavity over at least a position of said first electronic device and said cavity portion of said lower plate forming a second cavity over at least a portion of said second electronic device and separated from said first mold cavity, and a planar buffer member positioned between the second side of the substrate of the first electronic device and the opposite second side of the substrate of the second electronic device.

19. The apparatus of claim 18, wherein each said first and said second electronic device has a conductor-grid-array on said one side of said substrate, and said planar buffer member has cut-out portions for insertion therein of conductor-grid-arrays of said first and said second electronic device.

20. The apparatus of claim 18, wherein each of said first and said second electronic devices has a conductor-grid-array on said one side of said substrate, and said planar buffer member has perforation apertures therein for insertion therein of said conductor-grid-arrays of said first and said second electronic devices.

21. A mold apparatus for one sided encapsulation at least two electronic devices simultaneously, said mold apparatus comprising:

at least two electronic devices, each electronic device having at least one exposed heat sink thereon the opposite side of an otherwise impermeable substrate, each of said at least two electronic devices having electronic components mounted on a first side of a respective substrate having a varying thickness and having an opposite second side;

an upper mold plate and a mating lower mold plate, each mold plate having a mold cavity portion, matching cavity portions in each said upper and lower mold plates comprising a mold cavity configured solely for the first-side encapsulation of said at least two electronic devices having exposed heat sinks on the opposite second sides of said respective substrates situated back to back opposite second side to opposite second side in said mold cavity;

a force applying device for applying a force mating said upper mold plate and said lower mold plate about a substrate of an intervening first electronic device having an electrical component on a first side thereof and an exposed heat sink on an opposing side thereof and a substrate of an intervening second electronic device having an electrical component on a first side thereof and an exposed heat sink on an opposing side thereof, said opposing sides of said substrates disposed in contact with each other, said mold cavity portion of said upper mold plate forming a first mold cavity over at least a portion of said first electronic device and said mold cavity portion of said lower mold plate forming a second mold cavity over at least a portion of said second electronic device, said back-to-back substrates providing a substantially impermeable barrier between said first and second mold cavities; and passageways separately introducing material into each mold cavity portion of said first mold cavity and second mold cavity to encapsulate at least a portion of said first side of each said first and said second electronic device.

* * * * *